United States Patent [19]

Kikuchi et al.

[11] Patent Number: 4,712,158

[45] Date of Patent: Dec. 8, 1987

[54] COOLING SYSTEM FOR ELECTRONIC CIRCUIT COMPONENTS

[75] Inventors: Shunichi Kikuchi, Yokohama; Haruyuki Matsunaga, Atsugi; Hideo Katsumi, Sagamihara; Koji Katsuyama, Yokohama, all of Japan

[73] Assignee: Fujitsu Limited, Kanagawa, Japan

[21] Appl. No.: 843,947

[22] Filed: Mar. 26, 1986

[30] Foreign Application Priority Data

Mar. 28, 1985 [JP] Japan ................. 60-064391

[51] Int. Cl.$^4$ ............................................. H05K 7/20
[52] U.S. Cl. .................................. 361/385; 361/381; 361/382; 200/289; 174/16 R
[58] Field of Search .............. 361/386, 385, 384, 383, 361/382; 174/16 HS; 200/289

[56] References Cited

U.S. PATENT DOCUMENTS 3,993,123 11/1976 Chu et al. ........................... 361/382
4,155,402 5/1979 Just ..................................... 361/386
4,341,432 7/1982 Cutchaw ......................... 174/16 HS
4,551,787 11/1985 Mittal et al. ........................ 361/385
4,631,636 12/1986 Andrews ............................ 361/382

FOREIGN PATENT DOCUMENTS 151068 8/1985 European Pat. Off. .

Primary Examiner—Robert S. Macon
Attorney, Agent, or Firm—Armstrong, Nikaido, Marmelstein & Kubovcik

[57] ABSTRACT

A cooling system for electronic circuit components mounted on a printed circuit board, includes a cooling plate having a coolant passage, thermal contacts arranged on the cooling plate to be in resilient contact with the surfaces of the electronic components, which are cooled via the thermal contacts by liquid coolant flowing through the coolant passage. The cooling plate has one or more shortcut passages, the cross-sectional area of which is smaller than that of the coolant passage, to mutually connect predetermined portions of the coolant passage. The liquid coolant can be discharged from the cooling plate via the shortcut passage.

11 Claims, 12 Drawing Figures

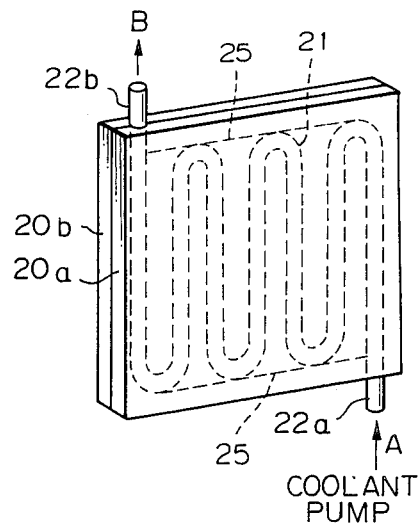
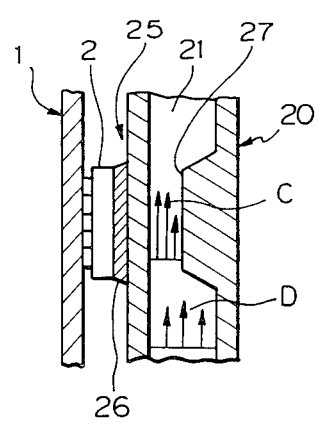
Fig. 2
Fig. 3
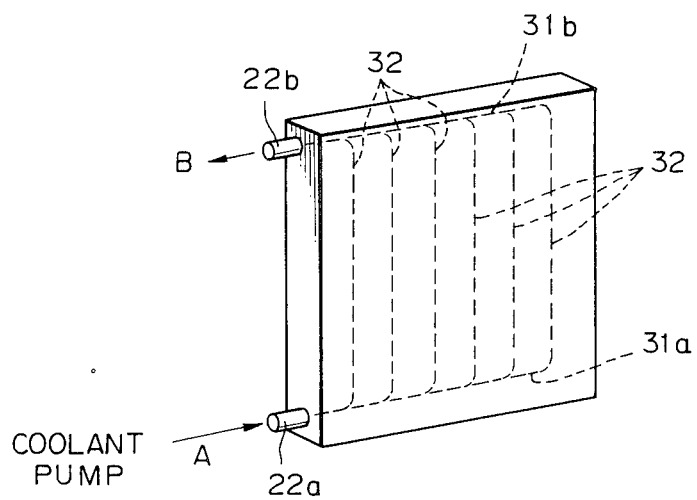
Fig. 4

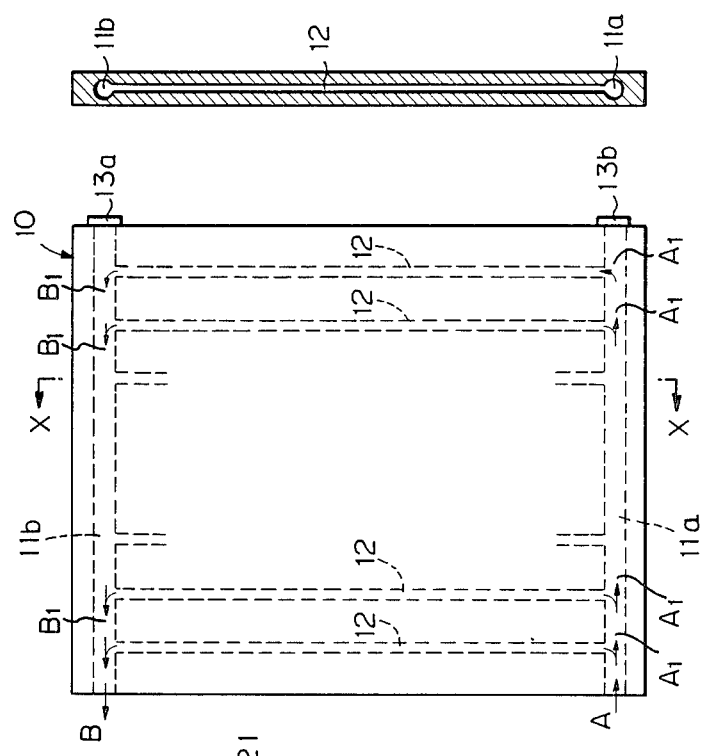
Fig. 10 (PRIOR ART)
Fig. 9 (PRIOR ART)
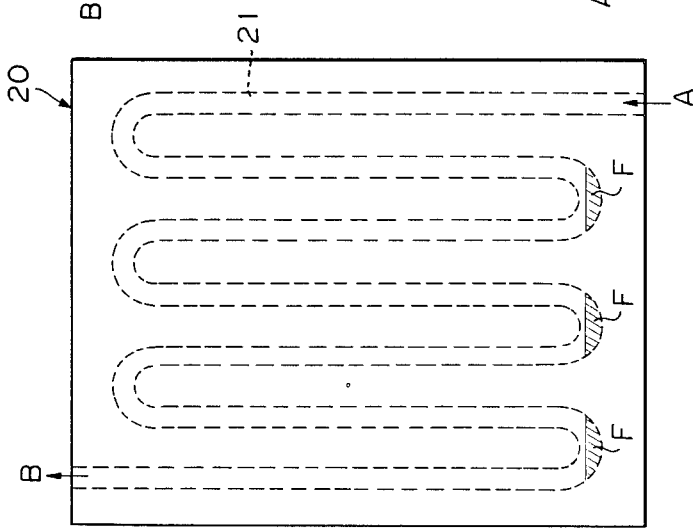
Fig. 11 (PRIOR ART)

COOLING SYSTEM FOR ELECTRONIC CIRCUIT COMPONENTS

BACKGROUND OF THE INVENTION

1. Field of the Invention

This invention relates to a cooling system for electronic circuit components, such as integrated circuit chips (IC) or semiconductor elements, mounted on a printed circuit board, and more particularly, to such a cooling system including a cooling plate in which liquid coolant is circulated.

2. Description of the Related Art

A cooling plate assembly used for cooling circuit components mounted on a printed circuit board or boards is disclosed in U.S. Pat. No. 4155402. In this liquid-cooling plate assembly, a liquid-cooled, cold plate with a complaint mat interface made of a heat conductive, electrically insulating complaint structure is arranged in compression contact with diverse circuit components on a printed circuit board so that intimate contact can be achieved with the circuit components, in spite of differences in the relative heights and shapes of the circuit components.

One of the typically known examples of the above-mentioned type of cooling system is shown in FIG. 8, which is an exploded perspective view illustrating a cooling plate arranged adjacent to a printed circuit board 1 on which a plurality of electronic components 2 are mounted, so that predetermined cooling points thereof are in contact with the top surfaces of the electronic components 2. Liquid coolant, such as a cooling water, is supplied into the cooling plate 3 via an inlet, as shown by an arrow A, and discharged via an outlet, as shown by an arrow B, so that the coolant is circulated through coolant passages in the cooling plate 3 to effect a cooling operation.

FIG. 9 is a plan view illustrating an arrangement of the coolant passage in a conventionally known cooling plate; and FIG. 10 is a cross-sectional view taken along a line X—X in FIG. 9. A cooling plate 10 in this example includes lower and upper horizontal main passages 11a and 11b and a plurality of vertical branch passages 12 connected therebetween. These main passages 11a and 11b are closed at their opposite ends by means of closing plugs 13a and 13b, respectively, in case the cooling plate 10 is manufactured by a process of machining.

Therefore, the coolant supplied, as shown by an arrow A, through one of the main passage 11a is separated and flows into the respective branch passages 12, as shown by the arrows A1. Then, the coolant confluences, as shown by arrows B1, and is discharged from the cooling plate 3, as shown by an arrow B.

FIG. 11 is a plan view illustrating an arrangement of the coolant passage in another example of a conventionally known cooling plate. In this case, a cooling plate 20 includes a single zig-zag passage 21. The coolant supplied as shown by an arrow A flows through the zig-zag passage 21 and is discharged from the cooling plate 20 as shown by an arrow B.

FIG. 12 is a cross-sectional view illustrating heat exchange elements 14 which can be provided in the cooling plate 10 or 20 as mentioned above with reference to FIGS. 9, 10 and 11. The heat exchanger element 14 made of a resilient or flexible member, such as a bellows, is rigidly attached to the cooling plate 10 or 20 on a coolant chamber 17 provided on a way of the branch passage 12 of the cooling plate 10 or the zig-zag passage 21 of the cooling plate 20.

The cooling plate 10 or 20 is vertically arranged adjacent to and in parallel with a printed circuit board 1 and maintained at a predetermined gap by means of spacer blocks 15 inserted therebetween, so that the top surfaces of the heat exchanger elements 14 are in resilient contact with the electronic components 2 mounted on the printed circuit board 1.

Therefore, the liquid coolant supplied into the branch passages 11 or the water passage 21, as shown by the arrows C1, is injected through nozzles 16 toward the elements 14 as indicated by the arrows C2. After the injection, the coolant flows into the next section of the branch passage 11 or the zig-zag passage 21, as shown by the arrows C3, and the same operation is repeated. Finally, the coolant flows out of the last cooling chamber 17 into the branch passage 11 or the passage 21.

However, according to the conventional cooling plate as mentioned above, when draining the coolant from the cooling plate is necessary, such as when the relevant electronic system is stopped for maintenance or transferred to another place, a part of coolant remains in blind portions, as indicated by reference E, of the coolant chambers 17 in the example shown in FIG. 9, or the bottom U-shaped blind portions, as indicated by reference F, of the zig-zag passage 21 in the example as shown in FIG. 11, even if the liquid coolant was drained from the respective inlet or outlet ports, by charging high-pressure gas from the opposite entrance. Therefore, the liquid coolant cannot be completely discharged from the conventional cooling plate 10 or 20. Also, if a part of coolant remains in the cooling plate, a damage to the electronic circuit components might occur due to an expansion of coolant and the cooling system might be sufferred from corrosion when the coolant freezes.

And more, when the pressure of the coolant changes rapidly or vibrates, such as water-hammer or ripple, the pressure in the cooling chamber 17 as shown in FIG. 12 becomes unstable and dangerous for electric circuit components.

SUMMARY OF THE INVENTION

An object of the present invention is to provide a cooling system for electronic circuit components, including a cooling plate, capable of completely discharging liquid coolant from the cooling plate in which liquid coolant is circulated when, for example, the relevant electronic system is stopped for maintenance or transferred to another place.

Another object of the present invention is to keep the balance of the flow at the cooling point 37 as shown in FIG. 7 or in the coolant passages of the cooling plate 21 as shown in FIG. 3.

According to the present invention, there is provided a cooling system for electronic circuit components mounted on a printed circuit board, including a cooling plate arranged substantially in parallel to the printed circuit board, the cooling plate having therein one or more coolant passages, thermal contact elements arranged on the cooling plate so as to be in resilient contact with the surfaces of the electronic circuit components, and means for supplying and circulating a liquid coolant and circulating through the coolant passage, so that the electronic circuit components are cooled via the thermal contact elements by the liquid coolant, characterized in that the cooling plate has one or more shortcut passages, the cross-sectional area of which is smaller than that of the coolant passage, to mutually connect predetermined portions of the coolant passage.

According to one of the preferred embodiments, the coolant passage is arranged in a zig-zag fashion or separated into a plurality of branch coolant passages so that the coolant circulates all over the cooling plate, the coolant passage has one or more blind portions when the cooling plate is vertically situated in a predetermined state, and the shortcut passage is arranged so as to mutually connect the bottoms of those blind portions and to connect one of the bottoms of the blind portions to another lower level portion of the coolant passage, so that the liquid coolant is discharged under its own gravity via the shortcut passage and removed from the cooling plate.

And even if the pressure of the coolant changes rapidly, the condition of the cooling point can be kept in balance as there are two passages (main passage and shortcut passage) for the cooling point.

Therefore, the liquid coolant can be completely discharged from the cooling plate, without substantially affecting the cooling efficiency, when it is necessary to remove the coolant, such as when the relevant electronics system is stopped or transferred to another place. Therefore, any problems which would be caused by coolant remaining in the cooling plate, such as a freezing of the coolant, corrosion, or the like, are prevented.

BRIEF DESCRIPTION OF THE DRAWINGS

FIG. 2 is a perspective view of the cooling system shown in FIG. 1;

FIG. 3 is partial sectional view of a coolant passage of the cooling system shown in FIG. 1;

FIG. 4 is a perspective view of the cooling system of another embodiment according to the present invention;

DESCRIPTION OF THE PREFERRED EMBODIMENTS

Figure 1:
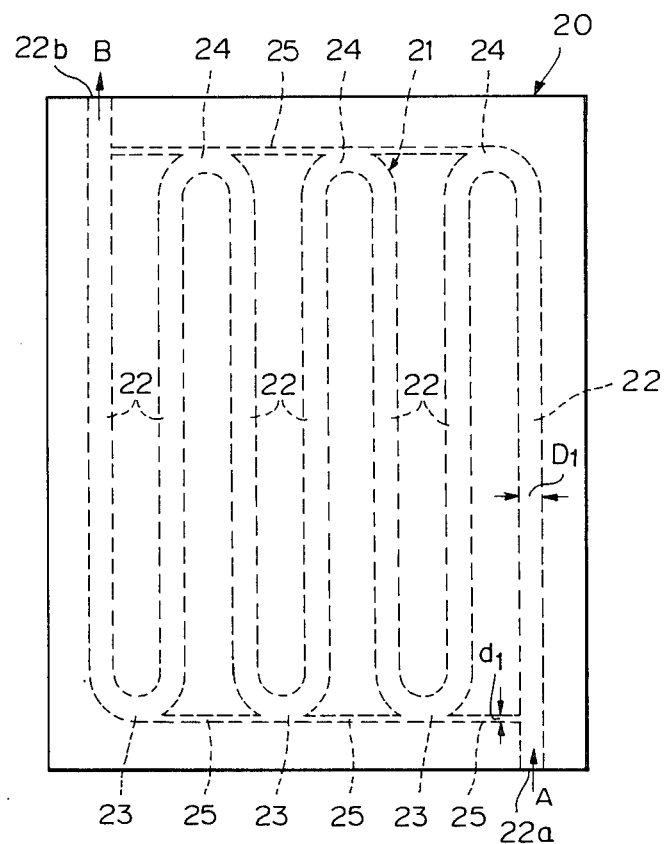
FIG. 1 is a plan view of a cooling system according to the present invention.

Referring now to FIGS. 1, 2, and 3, a cooling system according to a first embodiment of the present invention is illustrated, in which a cooling plate 20 has a single zig-zag coolant passage 21. That is to say, the coolant passage 21 comprises vertical straight portions 22, and U-shaped bottom and top curved portions 23 and 24. The first vertical straight portion 22 extends to the bottom of the cooling plate 20 to be a coolant inlet 22a. On the other hand, the last vertical straight portion 22 extends to the top of the cooling plate 20 to be a coolant outlet 22b. The coolant passage 21 has a substantially uniform circular cross-section, the diameter of which is D1. The U-shaped bottom portions 23 are all located at the same level when this cooling plate 20 is placed vertically in a predetermined position. Of course the cooling plate 20 might be used as having horizontal straight portions 22, as if the cooling plate 20 in FIG. 1 was turned by 90° so that the left or right side is to be bottom. These adjacent both bottom and top portions 23 are mutually connected and are connected to the first vertical straight position 22 in the vicinity of the coolant inlet 22a by substantially horizontal shortcut passages 25, which have also a substantially uniform circular cross-section, the diameter d2 of which is 0.3 to 0.4×D1, or the cross-sectional area of d2 is 0.10 to 0.15 times the cross-sectional area of D1. But, as the flowrate of shortcut passages 25 depends on the loss of head in the main passage, these values about d2 have to be determined with careful thought to the flow characteristics of the cooling plate, especially in case the loss of head in main passage is small.

The cooling plate 20 can be made of any suitable material, preferably having a good heat conductivity, such as copper, aluminum, or stainless steel, by a process of machining, die-casting, pipe-moulding, or the like. In one embodiment, the cooling plate 20 can be made by abutting two plates 20a and 20b, as shown in FIG. 2, each having corresponding zig-zag grooves, to form the above-mentioned zig-zag coolant passage 21.

Figure 8:
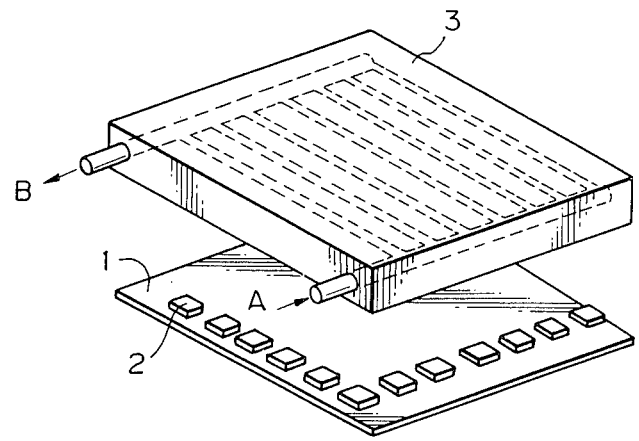

The cooling plate 20 is vertically situated adjacent a printed circuit board 1 (FIG. 3) in the same manner as mentioned above with reference to FIG. 8, so that predetermined cooling points of the cooling plate 20, as shown by a reference numeral 25 in FIG. 3, are in contact with the top surfaces of the electronic components 2 on the printed circuit board 1. At the cooling point 25, a heat transfer piece 26, preferably made of a highly heat conductive material, such as compound, insulating sheet or low melting-point solder, can be attached to the surface of the cooling plate 20. It is preferable that the cross-sectional area of the coolant passage 21 be reduced at the cooling point 25 by means of a barrier 27 on the opposite side of the heat transfer piece 26, as seen in FIG. 3.

When cooling the electronic components 2 mounted on a printed circuit board 1, a liquid coolant, such as water, fluorocarbon, or liquid metal, is supplied as shown by an arrow A from the coolant inlet 22a, which is connected to any suitable coolant source, such as a water pump, not shown in the drawings, into the zig-zag passage 21 and discharged as shown by an arrow B from the outlet 22b, so that the coolant is circulated through the coolant passage 21. If there is air in the coolant passage or in the shortcut passage 26, the air is discharged toward the outlet 22b and removed therefrom by the coolant flow. A part of coolant flows through the shortcut passages 26. However, the flow of coolant flowing through the main coolant passage 21 is reduced by only about 10%, since the cross-sectional area of the shortcut passages 26 is much smaller than that of the main coolant passage 21. Therefore, the reduction of the cooling efficiency would be almost negligible. On the other hand, the velocity of the coolant is increased as indicated by C at the cooling point 25 due to the reduction of cross-sectional area with respect to that of the main passage 21 as indicated by D. Therefore, the cooling efficiency would be increased by a rapid heat exchange at the cooling point 25. In this case, the above-mentioned D1 should be the diameter of the passage 21 at the paint C.

When removing the liquid coolant from the cooling plate 20, the coolant remaining in the zig-zag passage 21 flows through the shortcut passages 25 to the coolant inlet 22a. As there are no blind portions, as indicated by reference F in FIG. 11, no coolant remains in the passage 21, but the coolant is completely discharged from the cooling plate 20. As mentioned above, it is possible to turn the cooling plate 20 shown in FIG. 1 by 90° so that the left or right side is to be bottom. In this case, the coolant or remaing air can also be completely discharged from the cooling plate 20.

Another embodiment of a cooling plate is shown in FIGS. 4 through 7, in which a cooling plate 30 is similar to a conventionally known one such as shown at 10 in FIG. 9. That is to say, the cooling plate 30 has lower and upper horizontal main passages 31a and 31b and a plurality of vertical branch passages 32 arranged in parallel to each other so as to connect the lower horizontal main passage 31a to the upper horizontal main passage 31b. However, the heat exchanging portion in this embodiment is quite different from that of the conventional one mentioned above with reference to FIG. 12.

Figure 5:
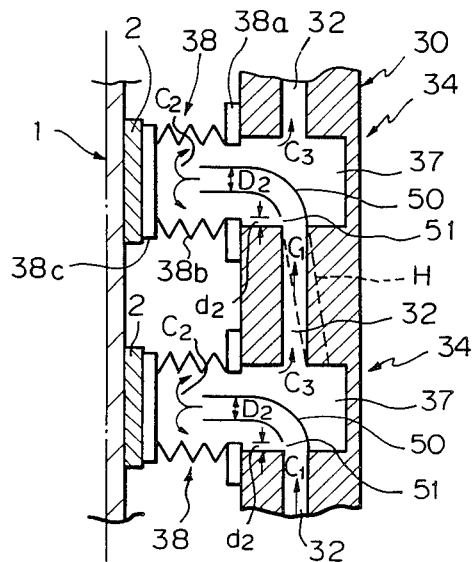
FIG. 5 is a partial cross-sectional view of a coolant passage in the embodiment as shown in FIG. 4.
Figure 6:
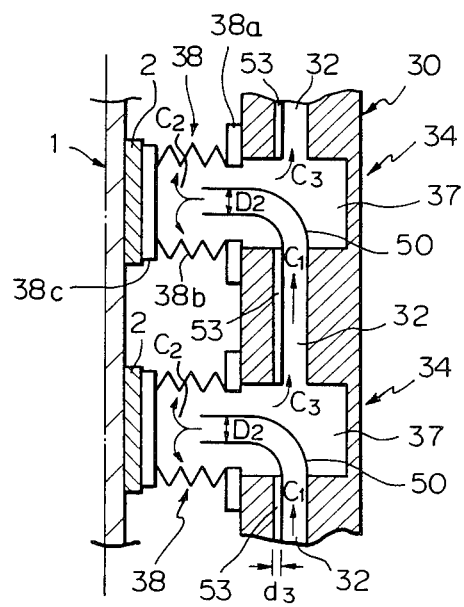
FIG. 6 is a partial cross-sectional view of a coolant passage similar to FIG. 5.
Figure 7:
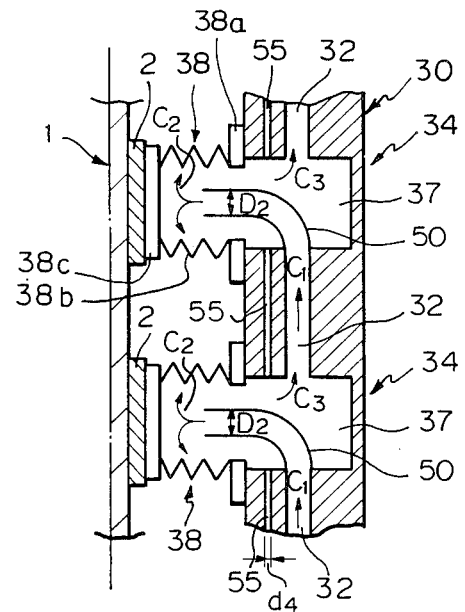
FIG. 7 is a partial cross-sectional view of a coolant passage also similar to FIG. 5; and, FIGS. 8, 9, 10, 11,, and 12 are views illustrating conventional types of cooling systems, as mentioned above.

Several embodiments of the heat exchanging portion are illustrated in FIGS. 5, 6, and 7, in which a heat exchange unit 34 is provided in each of the cooling points. The heat exchange unit 34 comprises a coolant chamber 37 provided in the cooling plate 30 on the way of the branch passage 32, and a hollow resilient member 38 mounted on the open end of the coolant chamber 37. The hollow resilient member 38 comprises a sealing base 38a sealingly attached to the surface of the cooling plate 30, a bellows 38b, and a heat transfer piece 38c mounted on the top of the bellows 38b so as to be in direct and resilient contact with the surface of a corresponding electronic component 2 mounted on a printed circuit board 1. The hollow resilient member 38 is made of any suitable good heat conductive metallic or nonmetallic material, such as plastic, by a known process. A nozzle pipe 50 is protruded from the branch passage 32 into the coolant chamber 37 and directed toward the heat transfer piece 38c via the inside of the easily direct the liquid coolant toward the heat transfer piece 38c.

In an embodiment shown in FIG. 5, the pipe 50 has a small opening 51 at a side of the hollow resilient member 38 and at a position of the bottom level of the coolant chamber 37. The diameter d2 of the opening 51 is 0.3 to 0.4 times the inner diameter D2 of the nozzle 50, or the cross-secetional area of d2 is 0.10 to 0.15 times the cross-sectional area of D2, inthe same manner as the above-mention embodiment.

In another embodiment shwon in FIG. 6, the heat is 0.10 to 0.15 times the cross-sectional area D2 of the nozzle 50, in the same manner as the above.

In still another embodiment shown in FIG. 7, the heat exchange unit 34 comprises a bypass passage 55 formed in the cooling plate 30 and in parallel to the branch passage 32 at a side of the hollow resilient member 38 so that the passage 55 connects one coolant chamber 37 to the adjacent coolant chamber 37, in the same manner as in the embodiment shown in FIG. 6. Also in the same manner as the above, the diameter d4 of the passage 55 is 0.3 to 0.4 times the inner diameter D2 of the nozzle 50, or the cross-sectional area of d4 is 0.10 to 0.15 times the cross-sectional area of D2.

The cooling plate 30 can be made of the same material and in the same manner as the above-mentioned embodiment shown in FIGS. 1 and 2, and vertically situated adjacent to a printed circuit board 1 so that the heat transfer piece 38c is in direct and resilient contact with an electronic component 2 mounted on a printed circuit board 2.

When cooling the electronics component 2, a liquid coolant is supplied as shown by an arrow A from the coolant inlet 22a, into the bottom horizontal main passage 31a. Then, the coolant is separated and flows into the respective branch passages 32, as shown by C1. At the cooling point, the coolant is injected through the nozzle pipe 50, as shown by C2, toward the heat transfer piece 38c of the resilient heat exchange unit 38, so that the electronic component 2 which is in contact with the latter is effectively cooled. After the injection, the coolant flows through the coolant chamber 37 into the next section of the branch passage 32, as shown by C3, and the same operation is repeated in turn. Finally, the coolant flows out of the last cooling chamber 37 into the upper main horizontal passage 31b (FIG. 4) and is discharged from the coolant outlet 22b, as shown by B. At the cooling point, a part of coolant flows through the opening 51 (FIG. 5), the groove 53 (FIG. 6), or the bypass passage 55 (FIG. 7) directly into the next coolant chamber 37. However, the reduction of the cooling efficiency would be almost negligible, since the cross-sectional area for these bypassing flows is much smaller than that of the nozzle pipe 50, in the same manner as the above.

Figure 12:
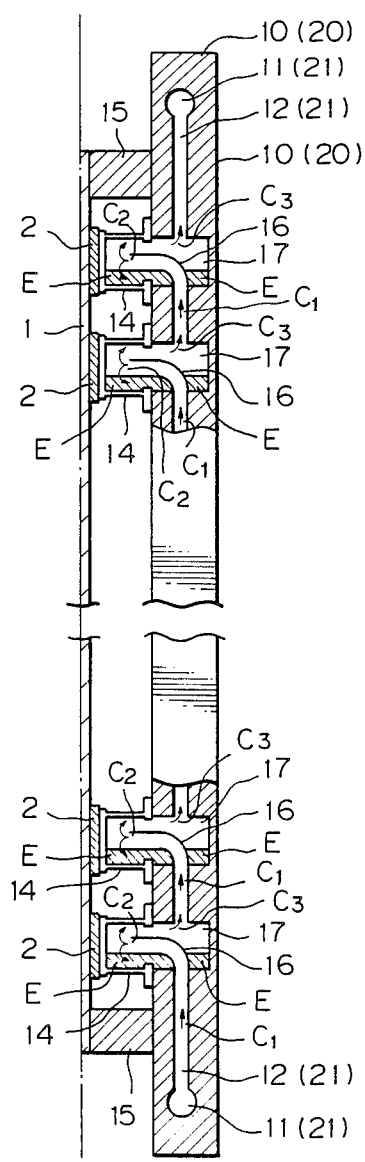

As there are no blind portions, as indicated by reference E in FIG. 12, when the coolant is removed from the cooling plate 30, no coolant remains in the coolant chamber 37, but the coolant is completely discharged through the opening 51 (FIG. 5), the groove 53 (FIG. 6), or the bypass passage 55 (FIG. 7) directly into the adjacent lower coolant chamber 37. Therefore, no liquid coolant remains in the cooling plate 30. On the other hand, it is sometimes advantageous to moderate the change of the coolant pressure in the chamber 37 by by-passing the coolant, so as not to affect to the electronic component 2 due to the pressure from the heat transfer piece 38c.

We claim:

1. A cooling system for electronic circuit components mounted on a printed circuit board, including a cooling plate arranged substantially in parallel with said printed circuit board, said cooling plate having therein one or more coolant passages, thermal contact elements arranged on said cooling plate so as to be in resilient contact with the surfaces of the electronic circuit components, and means for supplying and circulating liquid coolant, through said coolant passage, so that the electronic circuit components are cooled via said thermal contact elements by said liquid coolant, characterized in that, said cooling plate has one or more shortcut passages, the cross-sectional area of which is smaller than that of said coolant passage,. to mutually connect predetermined portions of said coolant passage.

2. A cooling system as set forth in claim 1, wherein said coolant passage is arranged in a zig-zag fashion or separated into a plurality of branch coolant passages so that the coolant circulates all over the cooling plate, said coolant passage having one or more blind portions when said cooling plate is situated vertically in a predetermined state, and said shortcut passage is arranged so as to mutually connect the bottoms of said blind portions and to connect one of said bottoms of the blind portions to another lower level portion of said coolant passage, so that the liquid coolant is discharged under its own gravity via said shortcut passage and is removed from the cooling plate.

3. A cooling system as set forth in claim 2, wherein said coolant passage is arranged in a zig-zag fashion and has substantially vertical straight portions arranged in parallel to each other and U-shaped bottom and top portions for connecting said straight portions in turn, at the bottom and top ends thereof, alternately, and said shortcut passage is arranged so as to mutually connect both said U-shaped bottom portions and top portions, respectively, and to connect one of said U-shaped bottom portions to one of the straight portions in the vicinity of the coolant inlet and to connect one of said U-shaped top portions to one of the straight portions in the vicinity of the coolant outlet.

4. A cooling system as set forth in claim 3, wherein said cooling plate which has said cooling passage arranged in a zig-zag fashion is placed as having substantially horizontal straight portions in parallel to each other and U-shaped portions on both sides for connecting said straight portions in turn.

5. A cooling system as set forth in claim 2, wherein said coolant passage has a reduced cross-sectional area at a cooling point, at which a contact element is arranged on the surface of the cooling plate.

6. A cooling system as set forth in claim 2, wherein said coolant passage comprises a lower horizontal main passage connected to a coolant inlet and an upper horizontal main passage connected to a coolant outlet, arranged substantially in parallel to each other, and a plurality of vertical branch passages arranged in parallel to each other and between said lower and upper main passages.

7. A cooling system as set forth in claim 2, wherein said cooling plate has a plurality of coolant chambers at cooling points, each of said cooling chambers is closed by said contact element, said coolant element comprises a hollow resilient member, which defines therein a part of said coolant chamber, a nozzle pipe is protruded from said coolant passage into said coolant chamber so that the coolant is injected toward a portion of the hollow resilient member opposite to the electronic component to be cooled.

8. A cooling system as set forth in claim 7, wherein said shortcut passage comprises at least one opening provided in said pipe nozzle at a bottom level of said coolant chamber.

9. A cooling system as set forth in claim 7, wherein said shortcut passage comprises at least one groove provided in the cooling plate, at each cooling point, said groove extends along the coolant passage to the adjacent cooling chamber.

10. A cooling system as set forth in claim 7, wherein said shortcut passage is arranged in parallel to the coolant passage, at each cooling point, and extends to the adjacent cooling chamber.

11. A cooling system as set forth in claim 1, wherein the cross-sectional area of said shortcut passage is 0.10 to 0.15 times that of said coolant passage.

* * * * *